United States Patent
Sarlet et al.

(10) Patent No.: US 7,058,096 B2
(45) Date of Patent: Jun. 6, 2006

(54) WIDELY WAVELENGTH TUNABLE INTEGRATED SEMICONDUCTOR DEVICE AND METHOD FOR WIDELY WAVELENGTH TUNING SEMICONDUCTOR DEVICES

(75) Inventors: Gert Sarlet, Bruges (BE); Jens Buus, Gayton Northants (GB); Roel Baets, Deinze (BE)

(73) Assignee: Interuniversitair Microelektronica Centrum (IMEC vzw), Leuven (BE)

( * ) Notice: Subject to any disclaimer, the term of this patent is extended or adjusted under 35 U.S.C. 154(b) by 165 days.

(21) Appl. No.: 10/722,277

(22) Filed: Nov. 25, 2003

(65) Prior Publication Data
US 2004/0125833 A1    Jul. 1, 2004

Related U.S. Application Data

(63) Continuation of application No. 09/573,794, filed on May 16, 2000, now Pat. No. 6,728,279.

(60) Provisional application No. 60/155,386, filed on Sep. 22, 1999.

(30) Foreign Application Priority Data
May 17, 1999    (EP) .................................. 99870105

(51) Int. Cl.
*H01S 3/10*    (2006.01)
(52) U.S. Cl. .................... 372/20; 372/50.1; 372/43.01; 372/50.11; 372/99; 372/46.011
(58) Field of Classification Search .................. 372/20, 372/43.01, 99, 46.011, 44.01, 50.11
See application file for complete search history.

(56) References Cited

U.S. PATENT DOCUMENTS

| | | | | |
|---|---|---|---|---|
| 4,896,325 A | * | 1/1990 | Coldren | 372/20 |
| 5,325,392 A | * | 6/1994 | Tohmori et al. | 372/96 |
| 5,398,256 A | | 3/1995 | Hohimer et al. | 372/94 |
| 5,420,845 A | | 5/1995 | Maeda et al. | 346/135.1 |
| 5,555,253 A | | 9/1996 | Dixon | 372/100 |
| 5,621,828 A | * | 4/1997 | Baets et al. | 385/14 |
| 5,651,018 A | | 7/1997 | Mehuys et al. | 372/50 |
| 5,939,021 A | | 8/1999 | Hansen et al. | 422/41 |
| 6,243,517 B1 | | 6/2001 | Deacon | 372/102 |

(Continued)

FOREIGN PATENT DOCUMENTS

EP    0 926 787 A1    6/1999
JP    63229796    9/1988

OTHER PUBLICATIONS

Talneau et al., (1997) "Constant Output Power and Low Linewidth in a Simple Wide-Tuning DFB Laser with multiwavelength Grating," *IEEE Journal of Selected Topics in Quantum Electronics*, vol. 3, No. 2, pp. 628-631.

(Continued)

*Primary Examiner*—Minsun Oh Harvey
*Assistant Examiner*—Delma R. Flores-Ruiz
(74) *Attorney, Agent, or Firm*—McDonnell Boehnen Hulbert & Berghoff LLP

(57) ABSTRACT

Alternative laser structures, which have potentially the same tuning performance as (S)SG-DBR and GCSR lasers, and a fabrication process which is similar to that of the (S)SG-DBR laser, are presented. The advantage of these structures is that the output power does not pass through a long passive region.

14 Claims, 4 Drawing Sheets

U.S. PATENT DOCUMENTS

| | | | |
|---|---|---|---|
| 6,590,924 B1* | 7/2003 | Fish et al. | 372/96 |
| 6,690,688 B1* | 2/2004 | Gotoda | 372/20 |
| 6,728,279 B1* | 4/2004 | Sarlet et al. | 372/43.01 |
| 6,826,206 B1* | 11/2004 | Andersson | 372/20 |
| 6,909,734 B1* | 6/2005 | Coldren et al. | 372/96 |
| 2003/0035455 A1* | 2/2003 | Steffens | 372/50 |
| 2004/0174915 A1* | 9/2004 | Sarlet et al. | 372/20 |
| 2005/0249256 A1* | 11/2005 | He | 372/50.1 |

OTHER PUBLICATIONS

Kuznetsov, (1994) "Design of Widely Tunable Semiconductor Three-Branch Lasers," *IEEE Journal of Lightwave Technology*, No. 12, pp. 2100-2106.

Wolf et al., (1993) "Laser Diodes and Integrated Optoelectronic Circuits for Fiber Optical Applications," *European Transactions on Telecommunications and Related Technologies*, vol. 4, No. 6, pp. 19-34.

\* cited by examiner

WIDELY WAVELENGTH TUNABLE INTEGRATED SEMICONDUCTOR DEVICE AND METHOD FOR WIDELY WAVELENGTH TUNING SEMICONDUCTOR DEVICES

CROSS REFERENCE TO RELATED APPLICATIONS

This is a continuation of U.S. patent application Ser. No. 09/573,794, filed on May 16, 2000, now U.S. Pat. No 6,728,279. U.S. patent application Ser. No. 09/573,794 claims priority benefits to European Patent Application No. 99870105.6, filed on May 17, 1999. U.S. patent application Ser. No. 09/573,794 also claims priority benefits to U.S. Provisional Patent Application No. 60/155,386, filed on Sep. 22, 1999. This application incorporates by reference U.S. patent application Ser. No. 09/573,794, filed on May 16, 2000 and U.S. Provisional Patent Application No. 60/155, 386, filed on Sep. 22, 1999 in their entirety.

FIELD OF THE INVENTION

The invention relates to multi-section integrated semiconducting devices or lasers, comprising resonator sections, being either distributed reflection or transmission sections. The invention also relates to methods for widely wavelength tuning semiconductor devices or lasers.

BACKGROUND OF THE INVENTION

Tuning of a conventional Distributed Bragg Reflector (DBR) semiconductor laser is limited by the fact that the relative tuning range is restricted to the relative change in the refractive index of the tuning region. This means that the tuning range, under normal operating conditions, cannot exceed 10 nm. This is substantially less than the potential bandwidth, restricted by the width of the gain curve, which is about 100 nm. Such conventional DBR lasers can functionally be characterized as comprising a first part being a two-sided active section, for creating radiation, for instance a light beam, by spontaneous emission over a bandwidth around one center frequency. Said first part also guides said radiation or light beam. Such conventional DBR lasers further have two reflectors. Said reflectors are bounding said two-sided active section, thus one at each side.

The limited selectivity problem has been recognized by Wolf, et al (European Transactions on Telecommunications and Related Technologies, 4 (1993), No. 6) showing in FIG. 10 a laser structure with two parallel waveguides but without gratings. These two parallel waveguides cannot be considered as resonators, indeed the spectra (shown in FIG. 10b and c) show the comb mode spectra corresponding to arms B and A, but they are either the comb mode spectra of arm B, the gain section and the reflectors R or the comb mode spectra of arm A, the gain section and the reflectors R. As the spacing between the spectral lines are determined by the length of the structures, it appears that said spacing is still very small, resulting in still a low selectivity and a low tuneability.

Over the past years several advanced laser structures have been proposed with an extended tuning range. Examples are the Y-laser [M. Kuznetsov, P. Verlangieri, A. G. Dentai, C. H. Joyner, and C. A. Burrus, "Design of widely tunable semiconductor three-branch lasers," J. Lightwave Technol., vol. 12, no. 12, pp. 2100–2106, 1994], the co-directionally coupled twin-guide laser [M.-C. Amann, and S. Illek, "Tunable laser diodes utilizing transverse tuning scheme," J. Lightwave Technol., vol. 11, no. 7, pp. 1168–1182, 1993], the Sampled Grating (SG) DBR laser [V. Jayaraman, Z. M. Chuang, and L. A. Coldren, "Theory, design and performance of extended tuning range semiconductor lasers with sampled gratings," IEEE J. Quantum Electron., vol. 29, no. 6, pp. 1824–1834, 1993], the Super Structure Grating (SSG) DBR laser [H. Ishii, H. Tanobe, F. Kano, Y. Tohmori, Y. Kondo, and Y. Yoshikuni, "Quasicontinuous wavelength tuning in super-structure-grating (SSG) DBR lasers," IEEE J. Quantum Electron., vol. 32, no. 3, pp. 433–440, 1996] and the Grating assisted Coupler with rear Sampled Reflector (GCSR) laser [M. Öberg, S. Nilsson, K. Streubel, L. Bäckbom, and T. Klinga, "74 nm wavelength tuning range of an InGaAsP/InP vertical grating assisted codirectional coupler laser with rear sampled grating reflector," IEEE Photon. Technol. Lett., vol. 5, no. 7, pp. 735–738, 1993]. In the first two types of devices, a trade-off had to be made between the tuning range and the spectral purity (broad tuning range vs. high Side Mode Suppression Ratio (SMSR)). Therefore recently most research attention has gone to the (S)SG-DBR and GCSR lasers.

A sampled grating DBR laser, comprises of two sampled gratings exhibiting a comb-shaped reflectance spectrum, with slightly different peak spacing due to the different sampling periods. As an alternative, other grating shapes can be used: these are normally referred to as "super structure gratings" (SSG). Lasers of this type have been fabricated with tuning ranges up to about 100 nm. The operation of the device is such that through current injection in the two DBR sections, a peak of the front and rear reflectance comb are aligned at the desired wavelength. The phase section is used to align a longitudinal cavity mode with the peaks of the two reflectors. The disadvantage of the (S)SG-DBR approach is that light coupled out of the laser has to pass a long passive or inactive section, leading to loss. Also, the losses in the two reflector sections increase with the amount of current injected into those sections, leading to a tuning current dependent output power.

The SG-DBR laser and the SSG-DBR laser are functionally characterized as comprising a two-sided active region for light creation and two reflectors one at each side of the active region, said reflectors having a reflection characteristic with a plurality of reflection peaks. Said characteristic has spaced reflection maxima points providing a maximum reflection of an associated wavelength. Such a characteristic can be obtained via sampled gratings, which exhibit a comb-shaped reflection spectrum or via the so-called supergratings. Said gratings or supergratings can also be characterized as distributed reflectors.

Sampled gratings can be described as structures in a waveguide system, having a periodically broken short-period structure including short period stripped regions alternating with non-stripped regions. The supergratings can be described as structures in a waveguide system having a diffractive grating having a plurality of repeating unit regions, each having a constant length, thus forming a modulation period, and at least one parameter that determines the optical reflectivity of said diffractive grating varying depending on its position in each of said repeating unit regions along a direction of optical transmission in said laser, said diffractive grating extending by at least two modulation periods. Reference is made to U.S. Pat. No. 5,325,392 related to distributed reflector and wavelength tunable semiconductor lasers, which is hereby incorporated by reference in its entirety.

The SG-DBR laser and the SSG-DBR laser exploit constructive interference of the periodic characteristics of reflectors, located at different sides of the active section, with different periodicity, to obtain a wide tunability. The alignment of the reflector peaks can be described by stating that the spacing of said reflective maxima points of the reflectors are different or are essentially not equal and only one said reflective maxima of each of said reflectors is in correspondence with a wavelength of said created lightbeam. Reference is made to patent U.S. Pat. No. 4,896,325, related to multi-section tunable lasers with differing multi-element mirrors, which is hereby incorporated by reference in its entirety.

As the construction of said reflectors leads to long inactive sections, this results in lasing output power losses.

Other lasers, which use a co-directional coupler, readily have a very wide tuning range, but there is insufficient suppression of neighbouring longitudinal modes. The combination of a widely tuneable but poorly selective co-directional coupler with a single (S)SG reflector will give both wide tuning and a good side mode suppression. Furthermore, the optical output signal does not pass through a passive region. Again tuning of 100 nm has been achieved. Unfortunately, such a structure is rather complicated to manufacture, requiring at least 5 growth steps. Reference is made to patent U.S. Pat. No. 5,621,828 related to integrated tunable filters, which is hereby incorporated by reference in its entirety.

EP-A-0926787 describes a series of strongly complex coupled DFB lasers. In the disclosed structure, gratings are made within the active sections. Said gratings are selected such that no substantial interaction between the lasers, defined by a grated active section, in series is obtained. The disclosed structure enables generation of multiple wavelengths, even sumultaneously, but does not address the issue of selectivity and tuneability.

A parallel structure with a plurality of waveguides is disclosed in the PATENT ABSTRACT OF JAPAN, vol. 013, no. 026, 20 Jan. 1989, JP 63 229796 (Fujitsu Ltd. The disclosed structure again enables radiation of a plurality of wavelengths but does not address the issue of tuneability. The optical switch is operated for selecting a waveguide, thus no simultaneously optical connection between said waveguide is obtained.

AIM OF THE INVENTION

The aim of the present invention is to disclose laser structures which are easy to manufacture and which are widely tuneable and have low lasing output power losses.

SUMMARY OF THE INVENTION

In the present invention, alternative laser structures, apparatus or devices are presented, which have potentially the same tuning performance as (S)SG-DBR and GCSR lasers and which output power, and not pass through a long passive region.

An integrated/semiconductor tunable laser comprising a substrate made of a semiconducting material, a two-sided active section on said substrate, and a plurality of sections on said substrate, is disclosed. Said laser can be denoted as a multi-section integrated semiconductor laser. Said active section is radiation generating, for instance, but not limited to the range of optical radiation. All said sections are connected to one side of said active section. Note that this does not mean that they are directly coupled to said active section. In case of optical radiation, said connection can be denoted as an optical connection. At least two of said sections include a waveguide system. Each of said sections defines a resonator.

These resonator sections have a spectra with spaced maxima resonant points themselves. They are themselves either a filter or a reflector with a comb mode spectra.

The resonators used in the present invention have resonant characteristics with a plurality of resonant peaks. Alternatively it can be said that said resonators have spaced resonant maxima points providing a maximum resonance of an associated wavelength. The transmission filters used in the present invention have a transmission characteristic with a plurality of transmission peaks. Alternatively it can be said that said transmission filters have spaced transmission maxima points providing a maximum transmission of an associated wavelength. The reflectors used in the present invention have a reflection characteristic with a plurality of reflection peaks. Alternatively it can be said that said reflectors have spaced reflective maxima points providing a maximum reflection of an associated wavelength.

The spacing of said resonator maxima points corresponding to the transmission or reflective maxima points of at least two of said sections are selected to be essentially not equal or different. Said laser is therefore denoted as an integrated semiconductor laser with different reflection or transmission sections. The transmission and reflection characteristic of said transmission filters and reflectors are positioned relative to each other such that at least one of said transmission or reflective maxima of each of said two sections overlap each other. This means that said sections have at least one transmission or reflective maxima for a same first frequency. Due to the different spacings of said transmission or reflective maxima points a small shift of one of said transmission or reflective characteristics can result in overlapping of at least one other transmission or reflective maxima of each of said two sections. Said sections have then at least one second frequency in common, which can be largely different from said first frequency. Said shift can be due to current injections in said transmission or reflective sections. It can be said that said laser comprises means for injecting current into some of said plurality of sections, resulting in said transmission or reflection characteristic being shifted in wavelength. Said overlapping maxima points define a plurality of lasing wavelengths. Due to the small shifting of at least one resonator characteristic, said device jumps from a first set of lasing wavelengths to another set of lasing wavelengths. The spacings of the maxima resonant points are accordingly essentially determined by the grating instead of the length of the sections.

It can be said that said active section creates a radiation or a lightbeam by emission and that the device emits an emitted laser beam with the wavelength of said emitted lightbeam being in correspondence with said overlapping maxima of said transmission filters or reflectors. Said active section is thus creating radiation or a light beam by spontaneous emission over a bandwidth around a center frequency and guides said radiation or light beam and has (optical) amplification actions. Said emitted radiation or lightbeam does not pass through said plurality of sections. The combination of said plurality of sections, having a combinated reflection action, and said (optical) amplification action of said active section causes lasing at said set of lasing wavelengths. Due to the fact that small shifting of resonator characteristics results in large difference in the set of lasing wavelenghts, an optical laser having a wide tunability, is obtained. Said laser is therefore denoted widely wavelength tunable integrated semiconductor laser.

According to a preferred embodiment of the present invention, the active radiation-generating section is connected at one side to a plurality of grated sections, but said gratings are not included in said active section. Moreover the gratings are selected such that substantial interaction between the spectra of said gratings can be used because this is the working principle used for improving the selectivity. Therefore at least one of said resonant maxima of each of two said sections are overlapping with each other.

In an embodiment of the invention, only one of said resonator maxima points is overlapping. It can then be said that said active section creates a radiation or a lightbeam by emission and the device emits an emitted laser beam with the wavelength of said emitted lightbeam being in correspondence with said overlapping maxima of said transmission filters or reflectors. The combination of said plurality of sections, having a combinated reflection action with a single reflection wavelength, and said (optical) amplification action of said active section causes lasing at said single reflection wavelength, defined by said overlapping resonator maxima points.

In an embodiment of the invention, at least one of said plurality of sections is inactive. This means that such inactive section is not creating a lightbeam by emission.

In an embodiment of the invention, at least one of said plurality of sections is active. This means that such active section also creates a lightbeam by emission.

In an embodiment of the invention, at least one of said waveguide systems has a periodically broken short-period structure including short period stripped regions alternating with non-stripped regions. Such waveguide systems are also denoted as distributed, hence said laser is denoted a semiconductor laser with distributed reflection or transmission sections. In one aspect of the invention, two such waveguides can be found on the same side of the active region.

In an embodiment of the invention, at least one of said waveguide systems has a diffractive grating having a plurality of repeating unit regions each having a constant length, thus forming a modulation period, and at least one parameter that determines the optical reflectivity or transmission of said diffractive grating varying depending on its position in each of said repeating unit regions along a direction of optical transmission in said laser, said diffractive grating extending by at least two modulation periods.

In an embodiment of the invention, at least one of said waveguide systems is a ring resonator.

In an embodiment of the invention, the laser further comprises a plurality of power splitters, being exploited for optically connecting part of said plurality of sections and connecting part of said plurality of sections with said active section.

In an embodiment of the invention, said laser is a serial concatenation of said active section and a plurality of said sections.

In an embodiment of the invention, said laser is a connection of said active section to one single port side of a power splitter and a parallel connection of a plurality of sections to the other multi port side of said power splitter.

In an embodiment of the invention, said laser comprises phase sections, being exploiting for adjusting the round trip cavity phase and thus a lasing mode wavelength of the laser.

DETAILED DESCRIPTION OF THE PRESENTLY PREFERRED EMBODIMENTS

In the further description, several embodiments of the invention are presented. It must be clear that the scope of the invention is described by the claims.

The present invention discloses alternative laser structures, which have potentially the same tuning performance as (S)SG-DBR and GCSR lasers and which the output power does not pass through a long passive region. In said devices, there are passive or inactive regions on one side of the active region only.

Figure 1:
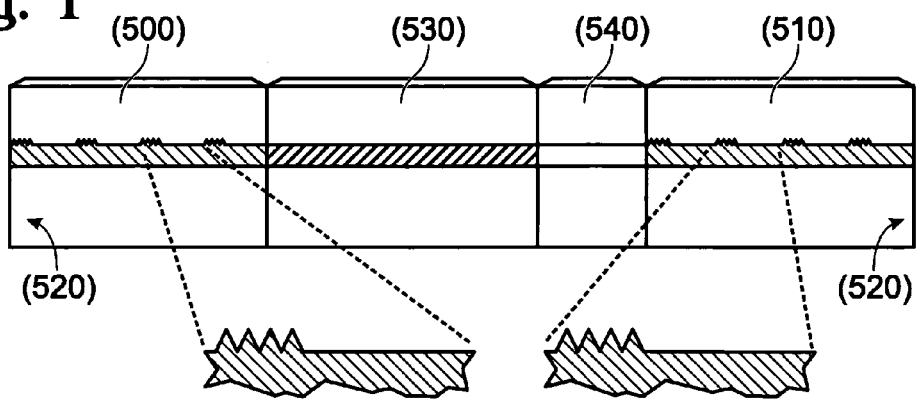
FIG. 1 is a longitudinal cross-section of an SG-DBR laser. As opposed to a conventional DBR laser, the reflectors are formed by two periodically modulated (sampled) gratings with different sampling periods.
Figure 7:
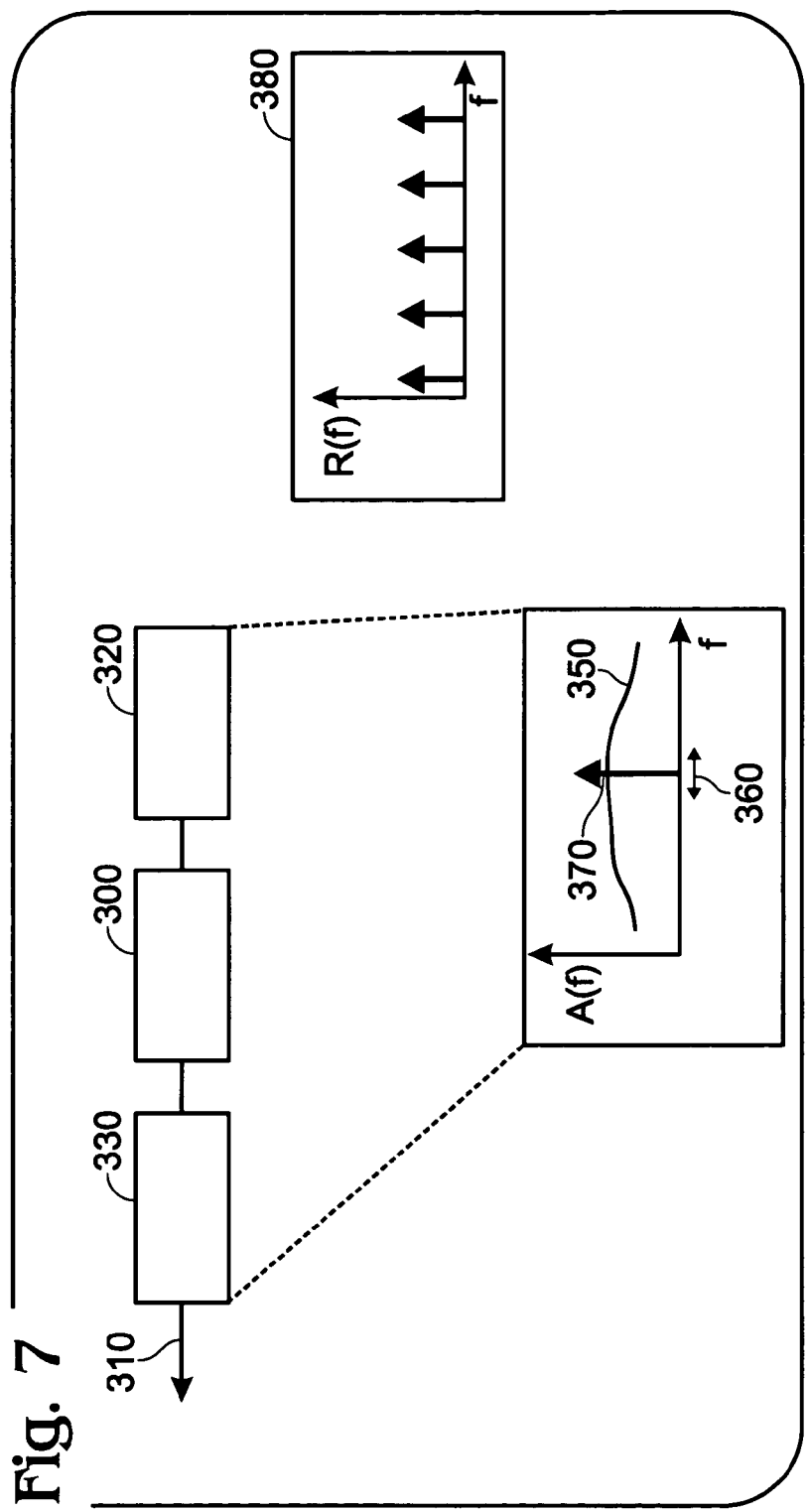
FIG. 7 is a principle scheme of prior-art lasers, comprising an active element and reflectors, said active element being bounded by said reflectors.

A principle scheme of prior-art conventional Distributed Bragg Reflector (DBR) semiconductor lasers is shown in FIG. 7. A schematic description of such a laser is shown in FIG. 1, showing a front reflector 500, a rear reflector 510, an AR (anti-reflective coating) 520, an active section 530 and a phase section 540. Tuning of said laser is limited by the fact that the relative tuning range 360, as shown in FIG. 7, is restricted to the relative change in the refractive index of the tuning region. This means that the tuning range, under normal operating conditions, cannot exceed 10 nm. This is substantially less than the potential bandwidth, restricted by the width of the gain curve 350, which is about 100 nm. Such conventional DBR lasers can functionally be characterized as comprising a first part being a two-sided active section 300, for creating a light beam 310 by spontaneous emission over a bandwidth around some center frequency 370, as observed in said lasers characteristic 340. Said first part also guides said light beam. Such conventional DBR lasers further have two reflectors 330, 320. Said reflectors are bounding said two-sided active section 300, thus one at each side.

A classical laser structure comprises (i) a two-sided active section/region, creating a light beam by spontaneous emission over a bandwidth around some center frequency and guiding said light beam, said active section performing optical amplification actions and (ii) two (inactive or passive) sections/regions, acting as reflectors. Said active section is bounded by said two reflectors.

Besides (inactive or passive) reflecting sections/regions, also sections with a transmission characteristic exist.

Figure 6:
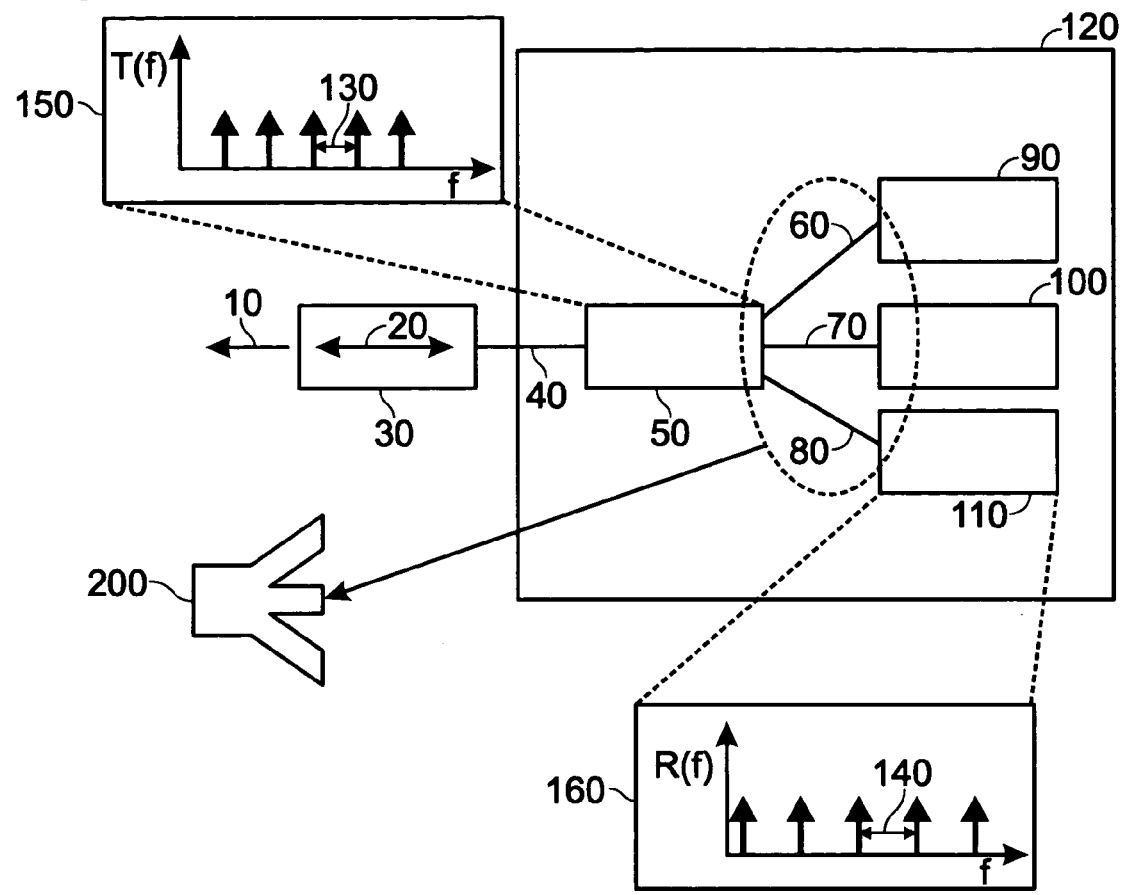
FIG. 6 is a principle scheme of the laser according to one aspect the invention, comprising an active element and a plurality of sections, being either transmission filters or reflectors.

The invention in one embodiment can be characterized as comprising a two-sided active section/region (just as a classical laser) and a plurality of sections/regions. Said plurality of sections/regions defines a network of sections/ regions. Said network of sections/regions is connected to one side of the active region. Said network comprises at least two resonator regions/sections. Said resonator regions/section can be either reflectors or regions/sections with a transmission characteristic. The principle scheme of the laser according to the invention, comprising an active element 30 and a plurality of sections 50, 90, 100, 110, being resonators, thus being either transmission filters or reflectors, is shown in FIG. 6.

The invention in one embodiment can be characterized as a device comprising (i) a substrate made of a semiconducting material, (ii) a two-sided active section on said substrate, said active section generating radiation by spontaneous emission over a bandwidth around some center frequency and guiding said radiation, said active section having amplification actions, and (iii) a plurality of sections on said substrate, all said sections being connected to one side of said active section, at least two of said sections including a waveguide system, defining either a transmission filter or a reflector. The device can further comprise a plurality of power splitters, being exploited for interconnecting part of said inactive sections and connecting part of said sections with said active section. Said sections can be either active or inactive.

When said device creates a light beam, said connection of said network with said active section is an optical connection. Said connections of said sections are then also optical. Said device can then be denoted as a tunable integrated/semiconductor optical laser. Said amplification is then denoted to be an optical amplification. Said active section then also guides said light beam.

In one embodiment of the invention, particular reflectors and sections with transmission characteristics are exploited. Said reflectors and sections with transmission characteristics are commonly denoted as resonators. Said reflection and transmission sections are functionally characterized as having a reflection or transmission characteristic with a plurality of reflection or transmission peaks, commonly denoted as resonant peaks. Said reflection or transmission characteristic has spaced reflection or transmission maxima points providing a maximum reflection or transmission of an associated wavelength. The resonator characteristic thus has a plurality of spectral response peaks, preferably narrow spectral response peaks. Said resonator characteristic can be either regular, meaning that its resonant frequencies are all spaced apart by a same value, being periodic, or irregular, meaning that there is no fixed spacing between its resonant frequencies. Irregularity can be a random pattern of resonant frequencies or some structured pattern.

Such a characteristic can be obtained via sampled gratings, which exhibit a comb-shaped reflection or transmission spectrum or via the so-called supergratings. Said gratings or supergratings can also be characterized as distributed reflectors or transmission sections.

Sampled gratings can be described as structures in a waveguide system having a periodically broken short-period structure including short period stripped regions alternating with non-stripped regions. The supergratings can be described as structures in a waveguide system having a diffractive grating having a plurality of repeating unit regions each having a constant length, thus forming a modulation period, and at least one parameter that determines the optical reflectivity or transmission of said diffractive grating varying depending on its position in each of said repeating unit regions along a direction of optical transmission in said laser, said diffractive grating extending by at least two modulation periods.

Figure 5:
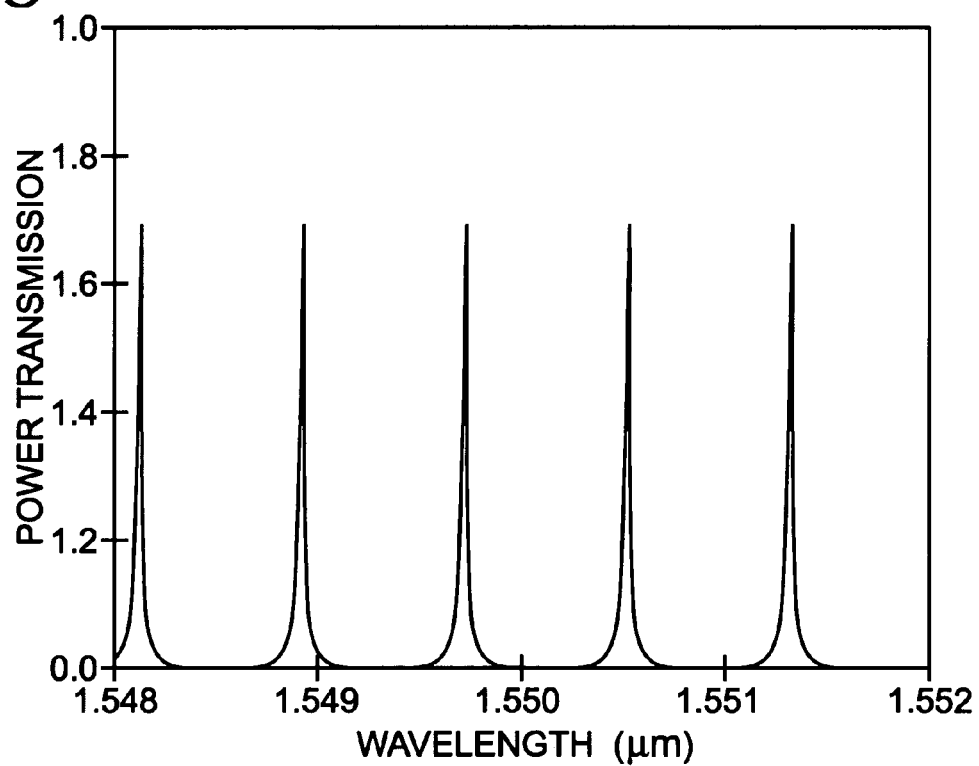
FIG. 5 is a transmission characteristic of a ring resonator.

In one aspect of the invention, alternative sections with transmission characteristics based on ring resonators are exploited. Such a ring resonator has a comb-shaped transmission characteristic (FIG. 5). The operation of a ring resonator is similar to that of a classic Fabry-Perot resonator, which can easily be understood if one thinks of the cross-coupling of the two couplers in the ring as being the transmission mirrors in the FP-resonator.

In the prior art, constructive interference of the periodic characteristics of reflectors, located at different sides of the active section, with different periodicity is exploited to obtain a wide tunability. As the construction of said reflectors leads to long inactive sections, this results in lasing output power losses.

In one aspect of the invention, constructive interference of the periodic characteristics of sections, being either reflective or transmissive, and with different periodicity and located at the same side of the active section is exploited. This approach results in wide tunability of said laser. Even when said reflectors are by construction long inactive sections, this is not harmful for the lasing output power, as these are only located at a single side of the active section. The invention results in a low loss window at any time.

Thus the invention can be further characterized by stating that the spacing of at least two transmission or reflective maxima points of the respective (inactive or even active) sections being essentially not equal or different, and at least one said transmission or reflective maxima of each of said (inactive or even active) sections being in correspondence with a wavelength of said created lightbeam. This correspondence is obtained by having at least one of said resonant peaks of at least two sections being overlapping or coinciding.

The combination of said plurality of sections can be considered as a combined reflector, having a combination reflection action. Said optical amplification action of said active section and said combination reflection action of said combined reflector are causing lasing at at least one of the reflection wavelengths of said combined reflector.

FIG. 6 shows an example of a possible configuration, although the invention is not limited hereto. The active section 30 is optically at one side connected with a plurality of sections 120, said plurality of sections comprising a transmission filter 50 and three reflectors 90, 100, 110. The lasing light 10 leaves the laser at the other side of the active section 30. Numeral 20 indicates the amplification action within said active section 30. Said connections 40, 60, 70, 80 indicate the optical interconnectivity and should not be considered as physical connections.

The transmission filters exploited in the invention have a transmission characteristic 150 with a plurality of transmission peaks. Alternatively, it can be said that said transmission filters have spaced (spacing 130) transmission maxima points providing a maximum transmission of an associated wavelength. The reflectors exploited in the invention have a reflection characteristic 160 with a plurality of reflection peaks. Alternatively it can be said that said reflectors have spaced (spacing period 140) reflective maxima points providing a maximum reflection of an associated wavelength. The spacing 130, 140 of said transmission or reflective maxima points of at least two of said sections are selected to be different. Said laser is therefore denoted as an integrated semiconductor laser with different reflection or transmission sections. The transmission and reflection characteristic of said transmission filters and reflectors are positioned such that only one of said transmission or reflective maxima of each of said sections is overlapping, meaning having a transmission or reflective maxima for the same frequency. Due to the different spacings of said transmission or reflective maxima points, a small shift of one of said transmission or reflective maxima points results in an optical laser having a wide tunability. Said laser is therefore denoted a widely wavelength tunable integrated semiconductor laser. Said shift can be due to current injections in said transmission or reflective sections. It can be said that said laser comprises means for injecting current into part of said plurality of sections, resulting in said transmission or reflection characteristic being shifted in wavelength.

The configuration of FIG. 6 can, for instance, be achieved by using a power splitter 200 for connecting section 50 with sections 90, 100, 110. Said power splitter has a single port side (side connected to 50) and a multi port side (side connected to 90, 100, 110, with three ports.

Figure 2:
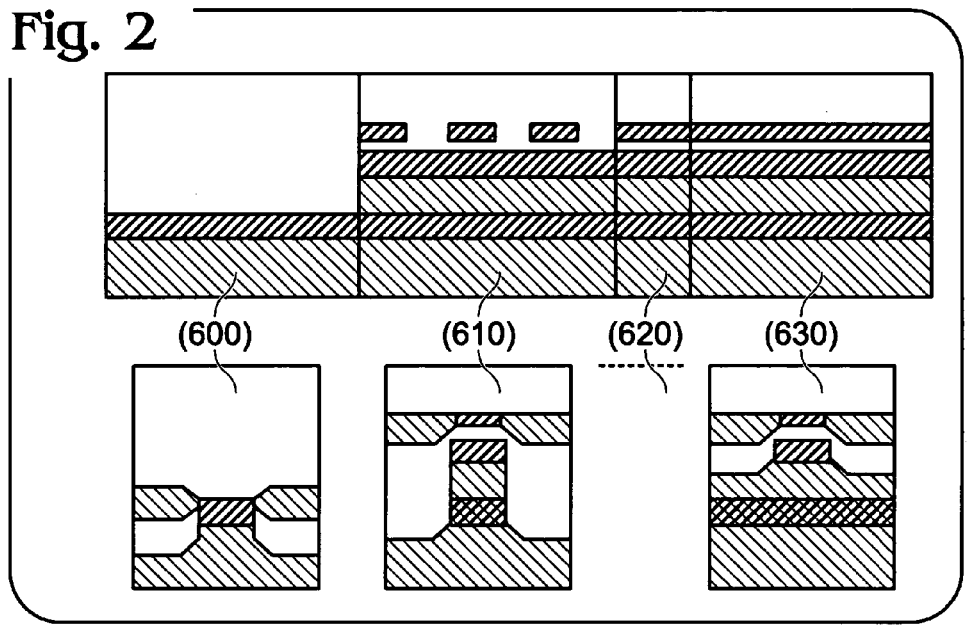
FIG. 2 is a schematic diagram of a GCSR laser structure.

A schematic view of a prior art GCSR laser structure is shown in FIG. 2, showing an active section 600, a coupler section 610, a phase section 620, and a reflector 630. FIG. 2 further shows the cross sections of said sections. Said coupler section 610 and said reflector section 630 have an essentially different resonance characteristic. Said coupler section 610 does not have spaced resonant maxima points.

Figure 3:
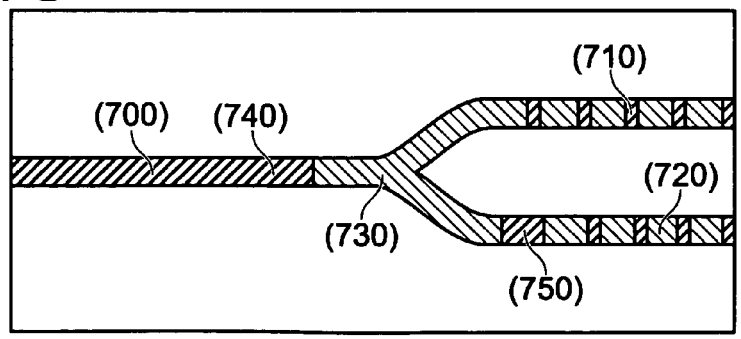
FIG. 3 is a top view (schematic) of the proposed "Y-SSG" laser.

In a first embodiment, a Y-structure as in FIG. 3 is proposed with two reflectors 710, 720, placed on the same side of the active region 700. These two reflectors use sampled or super structure gratings to provide reflection combs with different periods; their design is the same as for (S)SG-DBR lasers. The power splitter 730 is used to split/combine the light leaving/entering the active region 700. Two phase control sections 740, 750 are shown in FIG. 3. One provides the correct phase relation between the signals reflected by the two reflectors, whereas the second provides control of the overall phase of the combined reflected signal. According to an alternative embodiment, a separate phase control section could be placed in each of the arms of the Y. The branches of the Y-structure could be all-active, thus avoiding a (technologically more complex) transition from an active waveguide to a passive one. However, this has the disadvantage that the device will be more difficult to control, because power and wavelength control will be mixed. Therefore, passive waveguides for both branches of the Y-structure are preferred.

Figure 8:
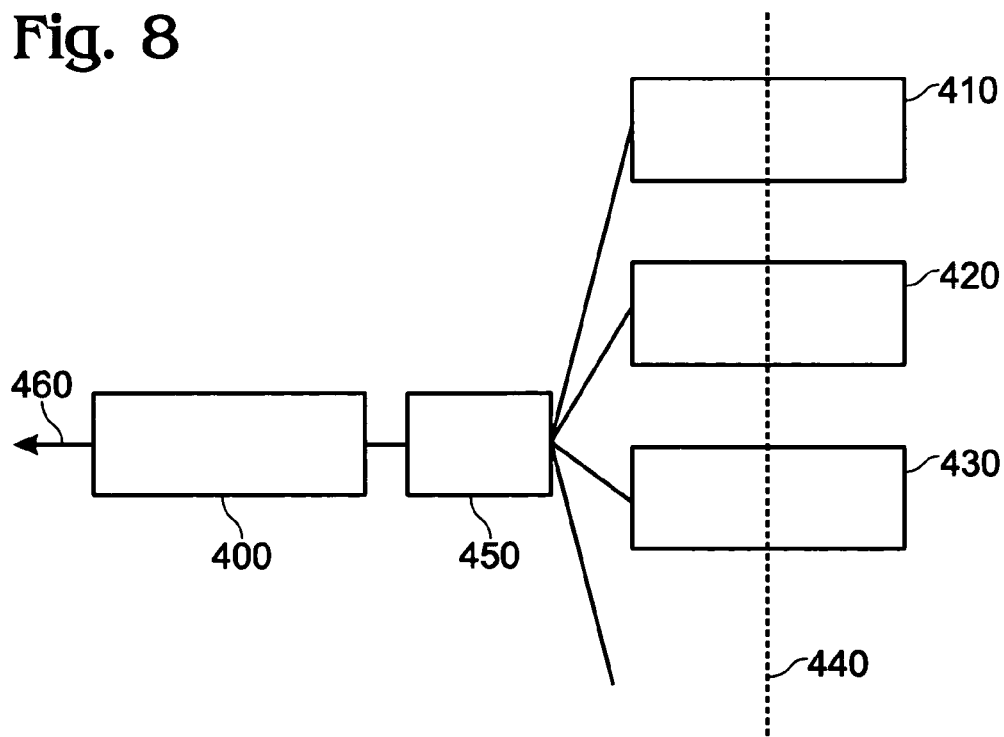
FIG. 8 is a principle scheme of the second embodiment of the invention, comprising an active element and a plurality of sections, being parallel.

In a second embodiment, a second structure, which in a top view looks like in FIG. 8, is proposed. In this structure, a plurality of reflectors 440 (including reflectors 410, 420, 430) are placed on the same side of the active region 400. At least two of said reflectors use sampled or super structure gratings to provide reflections combs. At least two of said reflectors have reflection combs with different periods. The design of said reflectors is the same as for (S)SG-DBR lasers. The power splitter 450 is used to split and combine the light leaving/entering the active region 400. Phase control sections can be introduced. In one configuration one phase control section is placed between the active region and the reflectors and in all reflectors, except one, also a phase control section is provided. In another configuration only phase control sections are provided in said reflectors.

Figure 4:
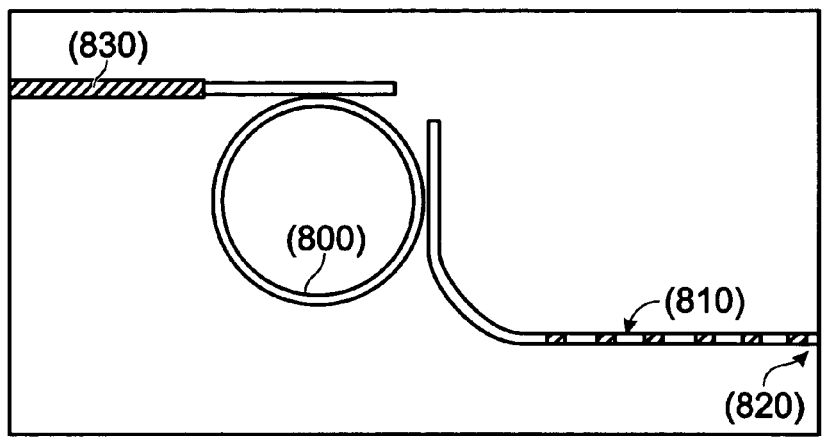
FIG. 4 is a schematic view of a ring resonator (S)SG laser.

In a third embodiment, a third structure, as shown in FIG. 4, is proposed. The reflector consists of an active section 830, a ring resonator 800, which has a comb-shaped transmission characteristic (one example is shown in FIG. 5) and a (S)SG-reflector 810 with, in one embodiment, anti-reflective coating 820. The operation of a ring resonator is similar to that of a classic Fabry-Perot resonator, which can easily be understood if one thinks of the cross-coupling of the two couplers in the ring as being the transmission mirrors in the FP-resonator. The tuning is again based on the "Vernier"-principle, as in conventional (S)SG-DBR lasers: the ring resonator and the (S)SG-reflector are designed to have slightly different peak-spacing in their transmission and reflection characteristics respectively, and lasing occurs at or near the wavelength where two peaks overlap each other. A phase section, used to align a longitudinal cavity mode with the two aligned peaks, could also be included in this structure. It could be placed either between the active section and the ring resonator, or between the ring and the (S)SG-reflector.

Figure 9:
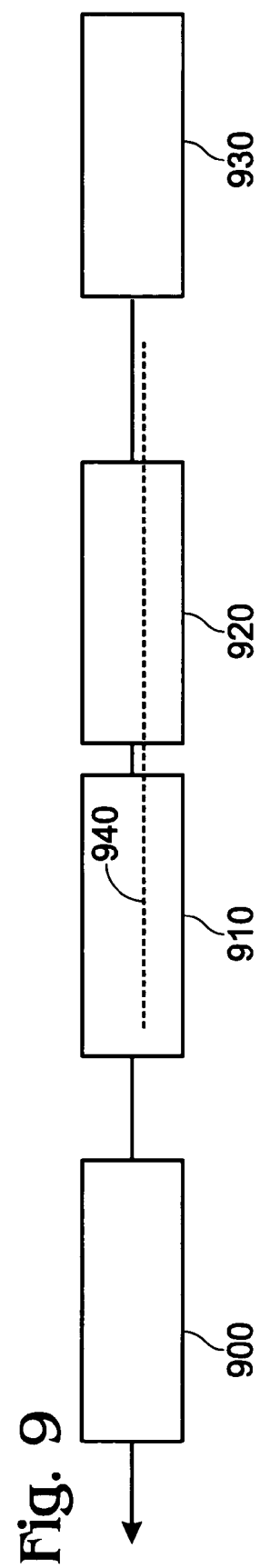
FIG. 9 is a principle scheme of the fourth embodiment of the invention, comprising an active element and a serial concatenation of transmission filters ended by a reflector.

In a fourth embodiment, a fourth structure, as shown in FIG. 9, is proposed. This structure comprises an active region 900 bounded at one side by a serial concatenation of sections, being a plurality of transmission filters 940, including filters 910, 920, said concatenation ends with a reflector 930. At least two of said sections, the sections being either transmission filter or reflector, have a comb-shaped transmission characteristic. At least two of said sections, the sections being either transmission filter or reflector, are designed to have a slightly different peak-spacing in their characteristic. A phase section can be placed between any of said sections and between said active section and said sections. Said transmission filters can be either (S)SG-transmission filters or a ring-resonator. Said reflector is a (S)SG-reflector.

A main feature of the proposed Y and ring-structures and any structure exploiting a combination of the principles on which the proposed Y and ring structures are based is that light is emitted directly from the active region without going through a passive region. This is expected to result in a higher efficiency and a lower degree of power variation during tuning. Typical reflectors can be designed to have a uniform envelope of the reflection peaks. These designs require long passive waveguides and the reflectivity at the reflection peaks is quite high. Both of these factors lead to a reduced efficiency in a two-sided reflector structure. In all proposed structures, the output power is not passing through a reflector, hence a high efficiency can be expected, and the high reflectivity is now an advantage. Therefore, in one aspect the invention, all of said sections are optically connected to one side of said active region.

Since the reflectors are preferably passive, the Y structure (of the first embodiment) and the structure of the second embodiment, do not suffer from the control problems present in the Y-laser known from prior-art.

The performance with respect to tuning and output power is expected to be similar to that of a GCSR laser, but the fabrication is easier. The number of process steps will be the same as for an SG/SSG, but lower than for a GCSR laser. Except for mask design, the fabrication is nearly identical to that for SG/SSG DBR lasers, but AR coating of the facets may not be necessary when the grating is designed for high peak reflectivity. As an alternative, one could use an absorbing region to kill off any unwanted reflection from the facet.

There may be some radiation losses associated with the power splitter in the Y-laser, but these are unlikely to be higher than the radiation losses in the tunable coupler section of the GCSR.

It is intended that the foregoing detailed description be regarded as illustrative rather than limiting and that it is understood that the following claims, including all equivalents, are intended to define the scope of the invention.

The invention claimed is:

1. A widely tunable laser apparatus comprising:
   a substrate comprising a semiconductor material;
   at least two resonator sections formed on the substrate, wherein each of the at least two resonator sections comprise one of a transmission filter and a reflector; and
   a two-sided active radiation-generating section formed on the substrate, the at least two resonator sections being coupled with a single side of the two-sided active section,
   wherein each of the at least two resonator sections comprises a waveguide system, each waveguide system operatively having spaced resonant maxima points, so as to provide one of a maximum transmittance and a maximum reflectance when subjected to energy of a frequency corresponding with one of the resonant maxima points, and
   wherein at least two spacings of the plurality of resonant maxima points are differently spaced in the frequency domain for at least two of the resonant sections.

2. The apparatus of claim 1, wherein the spacing of the plurality of resonant maxima points in the frequency domain is different for at least two of the resonator sections.

3. The apparatus of claim 1, wherein, at least one of the resonant maxima points of each of the at least two resonator sections are adjustably overlapping.

4. The apparatus of claim 1, wherein the active section creates a light beam as a result of spontaneous emission over a bandwidth around a center frequency and guides the light beam.

5. The apparatus of claim 1, wherein the active section creates a light beam as a result of spontaneous emission over a bandwidth around a center frequency and optically amplifies the light beam.

6. The apparatus of claim 5, wherein the apparatus produces a combined reflective action and the optical amplification causes lasing at at least one of the wavelengths associated with one of the reflective maxima points.

7. The apparatus of claim 1, further comprising a power splitter for coupling one or more of the at least two resonator sections with the active section.

8. The apparatus of claim 7, wherein the power splitter is coupled with the active section via a first side of the power splitter having a single port and coupled with the at least two resonator sections via a second side of the power splitter having a plurality of parallel connections.

9. The apparatus of claim 1, wherein only a single resonant maxima point of each of the at least two resonator sections overlap.

10. The apparatus of claim 1, further comprising one or more phase control sections coupled with at least the active section for adjusting a round trip cavity phase of the apparatus.

11. The apparatus of claim 1, further comprising one or more phase control sections coupled with at least one of said two resonator sections for adjusting a round trip cavity phase of the apparatus.

12. The apparatus as recited in claim 1, further comprising a current source coupled with the at least two resonator sections for injecting current into one or more of the at least two resonator sections, so as to cause one of a transmission characteristic and a reflection characteristic to be shifted in wavelength.

13. The apparatus of claim 1, further comprising one or more phase control sections coupled with one of the active section and the at least two resonator sections, wherein the phase control sections are employed to adjust a round trip cavity phase of the apparatus.

14. The apparatus as recited in claim 13, further comprising a current source coupled with the one or more phase sections for injecting current into one or more of the phase sections, so as to cause the roundtrip cavity phase of the apparatus to be adjusted.

* * * * *